(12) United States Patent
Merto et al.

(10) Patent No.: US 9,997,490 B2
(45) Date of Patent: Jun. 12, 2018

(54) WINDOW CLAMP

(71) Applicant: Texas Instruments Incorporated, Dallas, TX (US)

(72) Inventors: Ruby Ann Maya Merto, Baguio (PH); Jerry Gomez Cayabyab, Baguio (PH); Edsel Gomez Balagtas, Tarlac (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 208 days.

(21) Appl. No.: 14/663,978

(22) Filed: Mar. 20, 2015

(65) Prior Publication Data

US 2016/0276305 A1    Sep. 22, 2016

(51) Int. Cl.
*B23K 37/00* (2006.01)
*B23K 37/04* (2006.01)
*H01L 23/00* (2006.01)

(52) U.S. Cl.
CPC .............. *H01L 24/78* (2013.01); *H01L 24/77* (2013.01); *H01L 24/40* (2013.01); *H01L 24/41* (2013.01); *H01L 24/48* (2013.01); *H01L 2224/40245* (2013.01); *H01L 2224/45015* (2013.01); *H01L 2224/45124* (2013.01); *H01L 2224/45144* (2013.01); *H01L 2224/45147* (2013.01); *H01L 2224/48247* (2013.01); *H01L 2224/77704* (2013.01); *H01L 2224/78301* (2013.01); *H01L 2224/78704* (2013.01); *H01L 2924/14* (2013.01)

(58) Field of Classification Search
CPC .......................... B23K 20/004; B23K 37/0408
USPC ... 228/4.5, 44.7, 180.5, 212, 213, 49.1, 904; 257/666
See application file for complete search history.

(56) References Cited

U.S. PATENT DOCUMENTS

| | | | | |
|---|---|---|---|---|
| 5,954,842 A | * | 9/1999 | Fogal | B23K 20/004 228/110.1 |
| 6,062,459 A | * | 5/2000 | Sabyeying | B23K 20/004 228/4.5 |
| 8,796,826 B2 | | 8/2014 | Zhang et al. | |

OTHER PUBLICATIONS

Merto, Ruby Ann Maya; Subido, Wilmar Estandian; U.S. Appl. No. 14/294,671, filed Jun. 3, 2014 for "Window Clamp," 20 pages.

* cited by examiner

*Primary Examiner* — Erin B Saad
(74) *Attorney, Agent, or Firm* — Rose Alyssa Keagy; Charles A. Brill; Frank D. Cimino

(57) ABSTRACT

A wire bonding machine window clamp assembly. The assembly includes a support plate adapted to support a leadframe strip. The assembly also includes a frame structure defining a central clamp opening adapted to expose a portion of the leadframe strip. The frame structure includes at least one elongate frame member having a first surface portion adapted to engage a top surface of the leadframe strip and a second surface portion adapted to engage upper surfaces of integrated circuit ("IC") component stacks mounted on the leadframe strip.

7 Claims, 4 Drawing Sheets

WINDOW CLAMP

BACKGROUND

Semiconductor devices, to be useful, must be electrically connected to one another or to other electronic devices. Leadframes made from conductive metal such as copper, silver or gold are often used to electrically connect a semiconductor device to other electronic devices. One popular and flexible method of connecting semiconductor devices to leadframes is wire bonding. Bond wires usually consist of aluminum, copper or gold. Bond wire diameters typically range from about 15 μm to several hundred micrometers in high-power applications. There are two basic types of wire bonding—ball bonding and wedge bonding.

In ball bonding, a small molten ball is formed at the end of the bond wire by application of a high voltage charge through a tool known as a capillary that holds and dispenses wire. The molten ball is placed on the electrical contact surface of a chip. The contact surface is usually copper or aluminum. A combination of heat, pressure and ultrasonic energy is then applied, which creates a weld between the ball and the contact surface. The ball bond is sometimes referred to as the first bond because it is usually the first bond made in wire bonding of an IC chip/die to a leadframe.

In a die leadframe interconnection, the type of wire bond that is generally used to connect the second end of the bond wire to the leadframe is called a wedge bond or sometimes a second bond. It is formed by crushing the end of the bond wire between the leadframe or other metal surface and the tip of the capillary tool.

The quality of wire bonds formed on a leadframe is dependent on a number of factors including the stability of the leadframe on a support plate of the bonding machine.

DETAILED DESCRIPTION

This specification, in general, discloses a wire bonding machine window clamp assembly. The assembly includes a support plate adapted to support a leadframe strip. The assembly also includes a frame structure defining a central clamp opening adapted to expose a portion of the leadframe strip. The frame structure includes at least one elongate frame member having a first surface portion adapted to engage a top surface of the leadframe strip and a second surface portion adapted to engage upper surfaces of integrated circuit ("IC") component stacks mounted on the leadframe strip.

Figure 1:
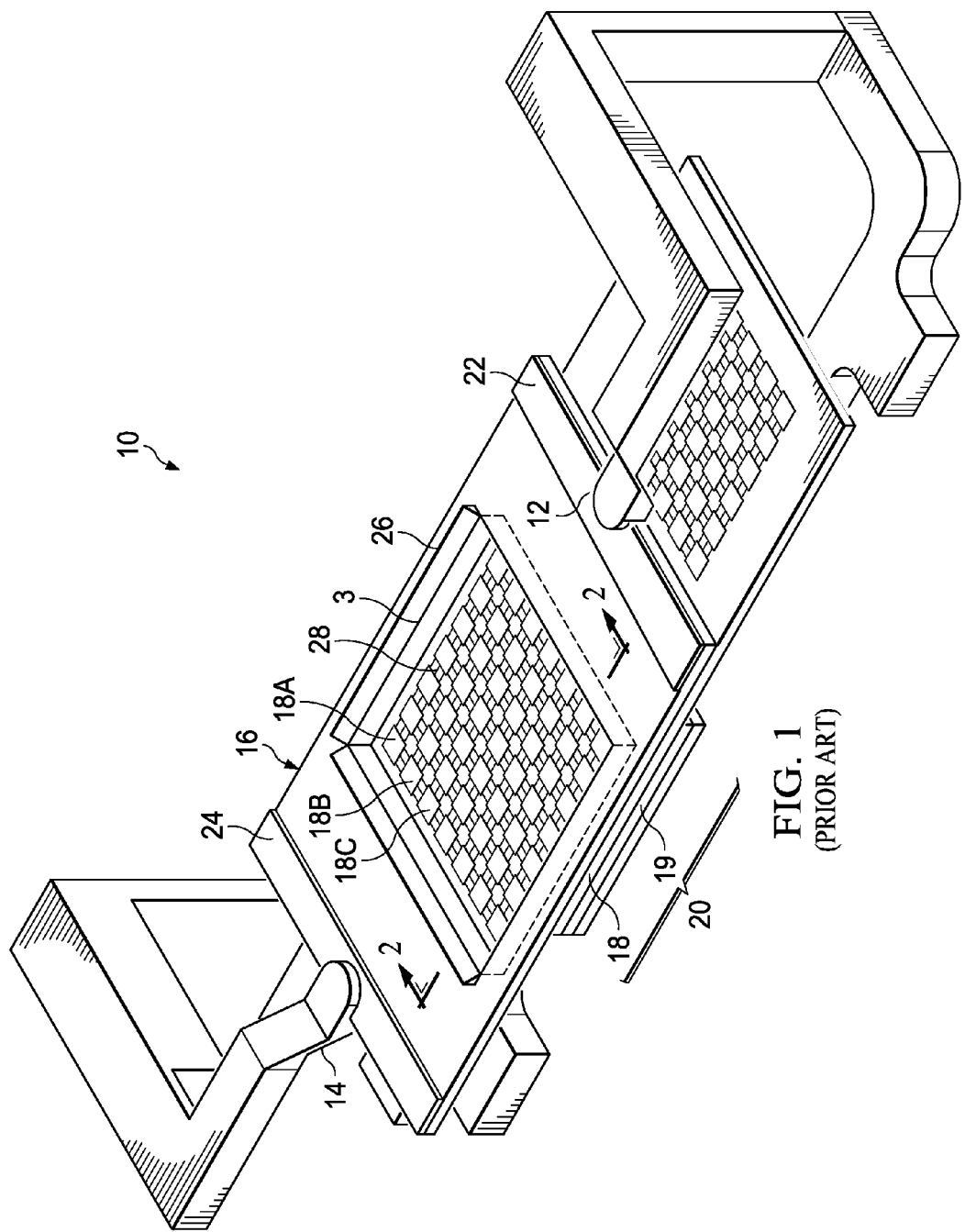
FIG. 1 is an isometric view of a prior art wire bonding machine supporting a leadframe strip.

FIG. 1 illustrates a prior art wire bonding machine 10. The wire bonding machine 10 has clamp holding arms 12, 14. These arms 12, 14 are adapted to engage a window clamp 16, which, in turn, engages a leadframe strip 18. The leadframe strip 18 has a plurality of integrally connected leadframe portions 18A, 18B, 18C, etc. Each component stack 18A, etc., has an IC component stack 21, FIG. 3 (not shown in FIG. 1) mounted on it.

Leadframe strip 18 is supported on a leadframe support plate 19. The support plate 19 is mounted on a heater block 20. In some wire bonding machine embodiments 10, the leadframe strip 18 is directly supported by the heater block 20, and there is no separate support plate 19.

Figure 2:
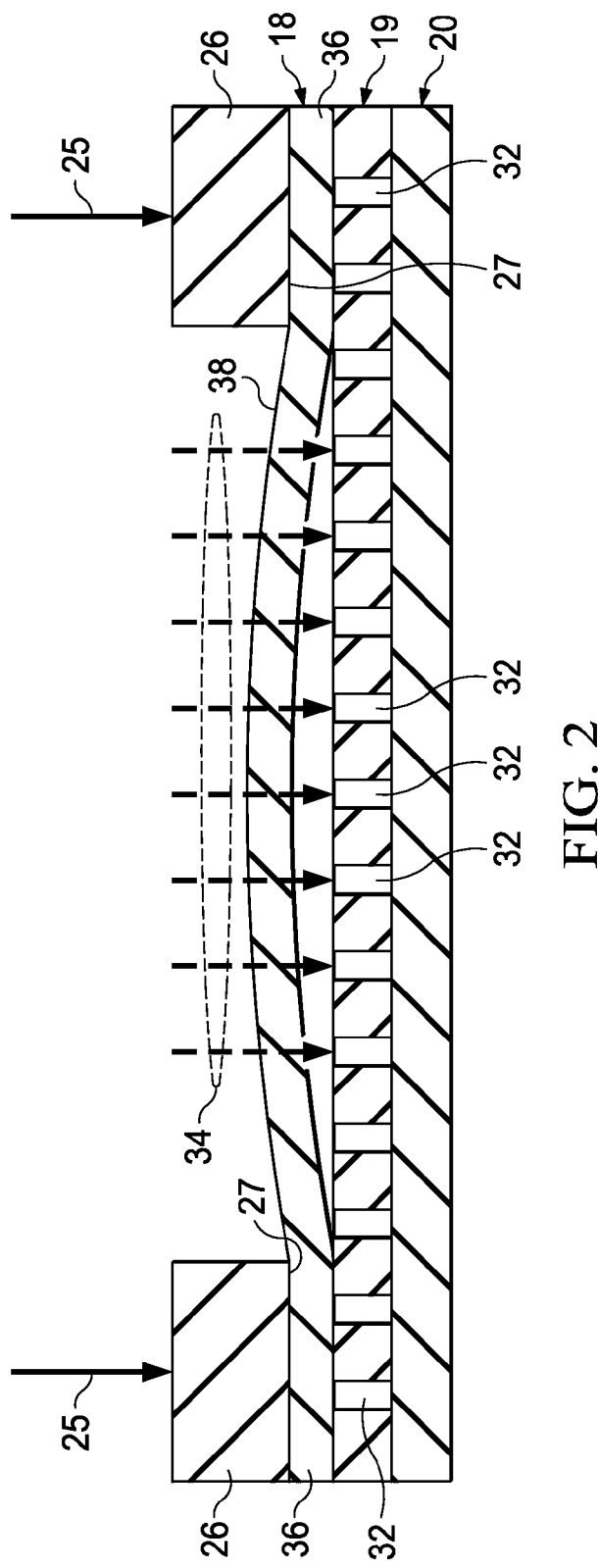
FIG. 2 is a cross-sectional elevation view of a portion of a window clamp of the prior art wire bonding machine of FIG. 1 engaged with a leadframe strip.

FIG. 2 is a cross-sectional elevation view of a portion of the window clamp 16 of the prior art wire bonding machine 10 engaged with a leadframe strip 18. The window clamp 16 has a frame structure 26 that defines a clamp central opening 28. The bottom surface 27 of the frame structure 26 engages the underlying leadframe strip 18. Window clamp 16 has a first and second support flange 22, 24, FIG. 1, extending outwardly from opposite sides of the frame structure 26. Support flanges 22, 24 are engaged by the wire bonding machine holding arms 12, 14. Referring again to FIG. 2, the holding arms 12, 14 apply a downward force 25 on the support flanges that is transmitted to the frame structure 26 and the underlying portions 36 of leadframe strip 18. The purpose of this downward force 25 is to hold the strip 18 in stationary relationship with the leadframe support plate 19.

As shown in FIG. 2, the support plate 19 has a number of tiny vacuum holes 32 extending through its upper surface that are adapted to be registered with portions of the leadframe strip 18. These vacuum holes 32 are in fluid communication with a vacuum manifold (not shown) and apply a suction force 34 to the bottom surface of the leadframe strip 18 to prevent it from vibrating during wire bonding operations. However, sometimes heat from the heater block 20 causes the leadframe strip 18 to expand. As a result, a portion 38 of the leadframe strip 18 that is not engaged by the window frame structure 26 buckles upwardly, as shown in FIG. 2. These buckled portions 38 of a leadframe strip 18 tend to vibrate during wire bonding operations performed on the strip 18. Such vibration tends to produce weak/defective wire bonds. Buckling of a leadframe strip 18 also uncovers some of the vacuum holes 32 beneath the buckled portion 38. This causes air 34 to enter the vacuum holes 32, reducing the vacuum force of the entire system. With the reduction in the system vacuum force, other portions of the leadframe strip 18 become disengaged from the plate 19, resulting in even more vibration and defective wire bonds.

Figure 3:
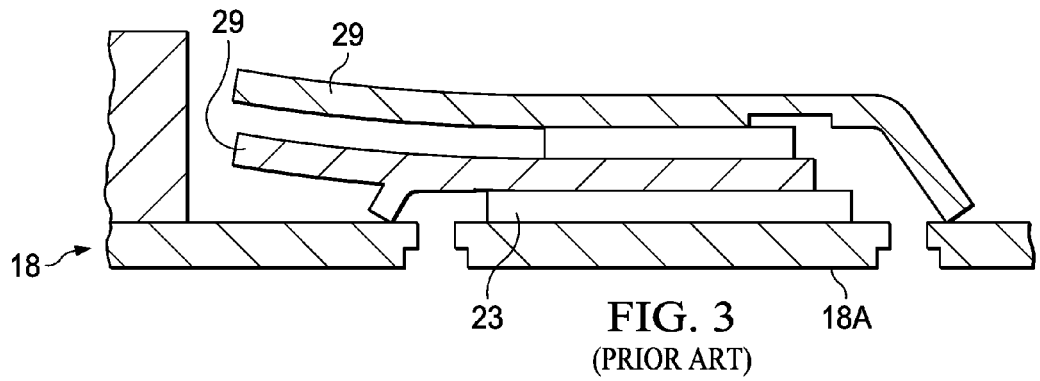
FIG. 3 is detail cross cross-sectional elevation view of an end portion of a leadframe and an associated component stack on which wire bonding is to be performed with the leadframe engaged by a prior art window clamp.

As shown by FIG. 3, in the prior art bonding machine 10, stacked component assemblies 21 (e.g. clip type QFN assemblies) are mounted on leadframe portions 18A, 18B, etc., of the leadframe strip 18. These leadframe portions and associated component stacks 23 located at the periphery of the leadframe strip 18 tend to micro bounce. Clip leadframes 29 on the stacks, due to their cantilever structures, also tend to vibrate and induce further vibration and bouncing in the leadframe strip 18.

Some prior art window clamps are provided with a window pain type gridwork within the frame structure. However such gridworks, like the frame structures 26, are relatively rigid and may damage the underlying leadframe and/or associated devices, such as integrated circuit dies, if the leadframe buckles. The risk of damage from such gridwork type clamps is particularly high with vertically stacked integrated circuit packages, such as QFN packages. Another window clamp assembly, such as described in U.S. patent application Ser. No. 14/294,671, filed Jun. 3, 2014 of Ruby Ann Maya Merto for WINDOW CLAMP includes wire strands rather than gridworks on a window clamp frame structure.

Window clamp assemblies, such as described with reference to FIGS. 3-6 below, may be used to overcome leadframe buckling, vibration and disengagement problems.

Figure 5:
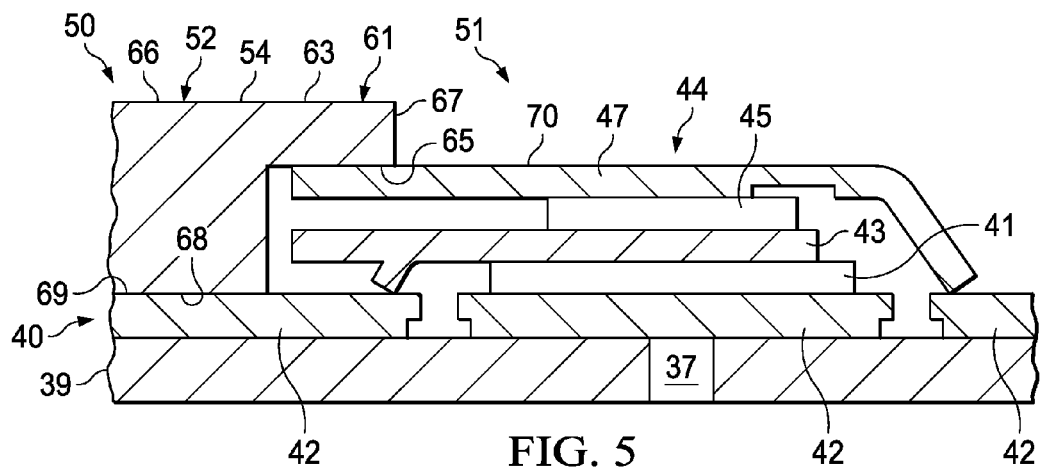
FIG. 5 is detail cross cross-sectional elevation view showing a leadframe portion of a leadframe strip and an associated Quad Flat No-lead ("QFN") component stack mounted thereon are engaged by the window clamp of FIG. 4.
Figure 4:
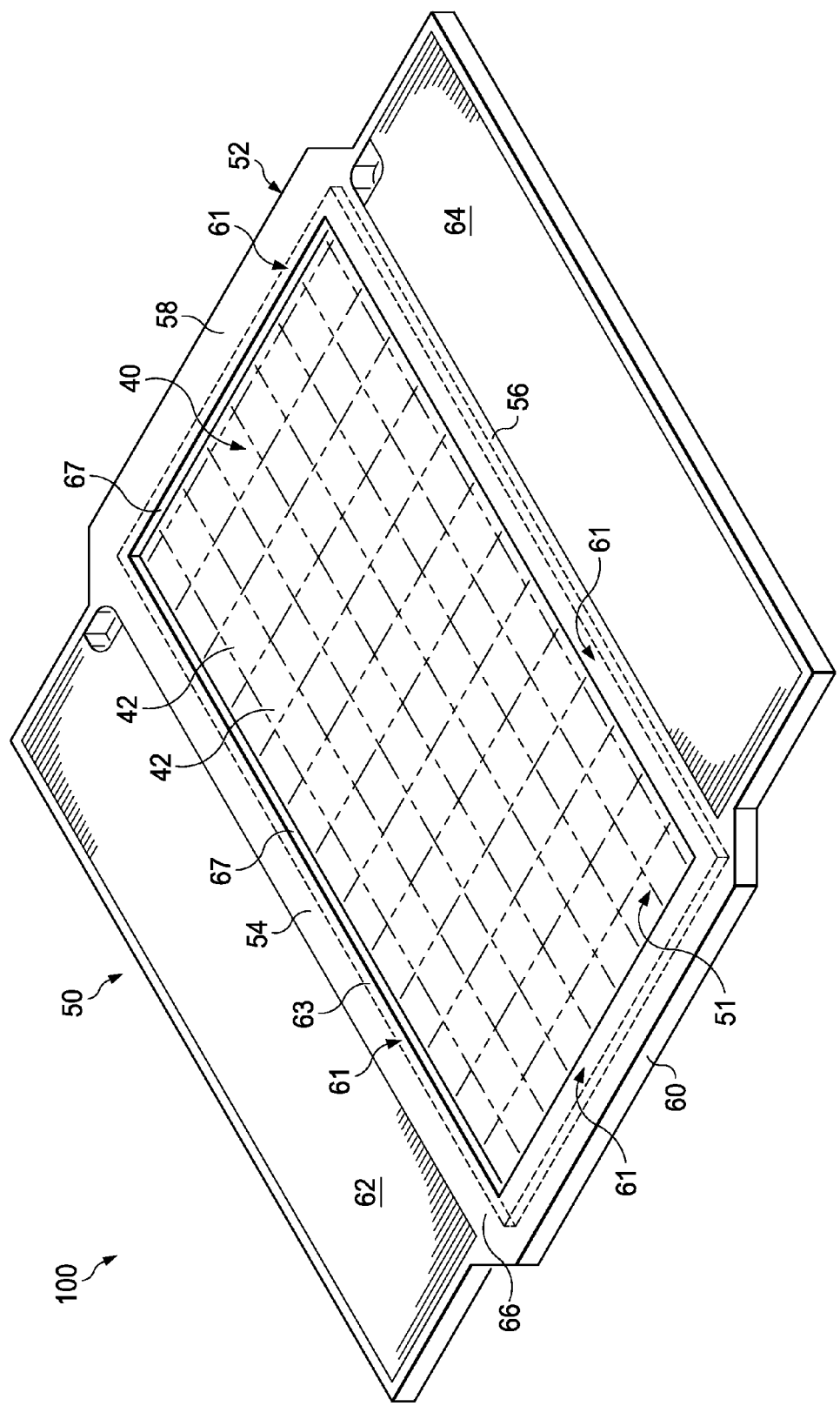
FIG. 4 is a top isometric view of an example embodiment of a window clamp of a wire bonding machine.

FIG. 4 is a top plan view of a bonding machine window clamp 50 and related structure of a wire bonding machine 100. The wire bonding machine 100, except for the window clamp 50, may have the same general structure as conventional wire bonding machines, such a machine 10 shown in FIG. 1. FIG. 5 is a cross sectional detail of a portion of the window clamp 50, shown in FIG. 4, and a leadframe strip 40 supported thereby. As best shown in FIG. 5, a leadframe support plate 39, which may be identical to leadframe support plate 19 described above, supports the leadframe strip 40. The structure below the support plate 39 may be the same as that described above with reference to FIG. 2. The leadframe strip 40 includes multiple leadframe portions, e.g. leadframe portion 42, that support QFN component stacks, such as stack 44 shown in FIG. 5. The components of the QFN component stack 44 may comprise a lower die 41, a lower clip leadframe 43, an upper die 45, and an upper clip leadframe 47. The components may be conventionally solder bond attached. The various components of the QFN component stack 44 and the leadframe portion 42 on which the stack 44 is mounted will ultimately be electrically connected through wire bonding performed by the wire bonding machine.

The window clamp 50 has a central opening 51 defined by a generally rectangular frame structure 52 that has an upwardly facing second surface portion 66 and a downwardly facing first surface portion 68. The frame structure 52 includes generally linear first, second, third and fourth frame structure portions 54, 56, 58 and 60. The first and second portions 54, 56 are generally parallel and extend perpendicular to the third and fourth portions 58, 60. A first support flange 62 extends laterally outwardly from the first linear portion 54 and a second support flange 64 extends laterally outwardly from the second linear portion 56.

Window clamp 50 is engaged with an underlying leadframe strip 40. Leadframe strip 40 is supported by a support plate 39, which has a plurality of vacuum holes 37 arranged in a grid. The vacuum holes 37 are adapted to be placed in registration with predetermined portions, e.g., the leadframe portions 42 of the leadframe strip 40. In some embodiments the support plate 39 is supported by a heater block, such as prior art heater block 20 described above. In other embodiments the leadframe strip is supported directly by a heater block. Such direct leadframe supporting heater blocks (not shown) generally have vacuum structure similar to that of the support plate 39.

As best shown by FIG. 5, at least one of the elongate frame members 54, 56, 58, 60, and in some embodiments all of the elongate frame members, comprise a downward facing second surface portion 69 that engages an second surface portion 70 of component stacks 44 positioned below it. In the embodiment illustrated in FIG. 5 the stack second surface portion 70 is an second surface portion of an upper clip leadframe 47.

The cross-sectional view of FIG. 5 represents the cross-sectional structure of at least one elongate frame member, e.g., 54, 56, 58, 60 from end to end thereof. In the illustrated embodiment of FIG. 4, all of the frame members have this configuration. As shown by FIGS. 4 and 5, each elongate frame member 54, 56, 58, 60 may comprise a flat bottom surface 68 that is adapted to engage a tip surface 69 of the leadframe strip 40. Each frame member 54, 56, 58, 60 may also comprise an integrally formed, lip portion 61 that extends towards the center of the central opening 51 in the window clamp 50. The lip portion 61 has a top surface 63 which may be continuous with the top surface 66 of the frame member. The lip portion 61 has a downwardly facing surface portion 65 and a surface portion 67 connecting the top surface portions 63 and downwardly facing surface portion 65. The downwardly facing surface portion 65 is adapted to engage the top surface 70 of a QFN component stack 44. Thus, each elongate frame member may comprise a first surface portion 68 adapted to engage a top surface of a leadframe strip 40 and a second surface portion 65 adapted to engage upper surfaces 70 of IC component stacks 44 mounted on the leadframe strip 40.

The above described frame structure 52, in one embodiment, engages both the peripheral portion of a leadframe strip 40 and the top surfaces of IC component stacks mounted adjacent to this engaged peripheral portion of the leadframe strip. Such engagement firmly holds the leadframe strip 40 in engagement with the window clamp support plate 39 and obviates micro-bouncing of the leadframe strip and defective wire bonds caused by such micro-bouncing.

Figure 6:
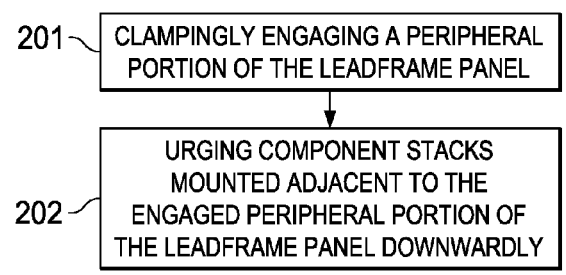
FIG. 6 is a flow chart of a method of clamping a leadframe strip in stable relationship with a leadframe support plate.

FIG. 6 is a flow chart of a method of holding a leadframe strip in stable relationship with a leadframe support plate having vacuum holes adapted to be registered with the leadframe strip. The method includes, as shown at block 201, clampingly engaging a peripheral portion of the leadframe strip. The method also includes, as shown at block 202, urging component stacks mounted adjacent to the engaged peripheral portion of the leadframe strip downwardly.

Although certain embodiments of a wire bonding machine window clamp assembly have been described in detail herein, alternative embodiments of a such an assembly will become obvious to those skilled in the art after reading this disclosure. It is intended that the appended claims be construed broadly to cover such alternative embodiments, except as limited by the prior art.

What is claimed is:

1. A method of holding a leadframe strip in stable relationship with a leadframe support plate:
    using a frame member to clampingly engage a peripheral portion of the leadframe strip having multiple leadframe portions, more than one of the leadframe portions being adjacent to the engaged peripheral portion of the leadframe strip and more than one of the leadframe portions not being adjacent to the engaged peripheral portion of the leadframe strip; and
    using the frame member to urge component stacks mounted on only the more than one of the leadframe portions that are adjacent to the engaged peripheral portion of the leadframe strip downwardly.

2. The method of claim 1 comprising performing said urging during said clampingly engaging.

3. The method of claim 1, said urging comprising engaging clip leadframes on said component stacks.

4. The method of claim 1, said clampingly engaging a peripheral portion of the leadframe strip comprising clampingly engaging a peripheral portion of the leadframe strip with a first surface portion of the frame member.

5. The method of claim 4, said urging component stacks mounted adjacent to the engaged peripheral portion of the leadframe strip downwardly comprising urging said component stacks downwardly with a second surface portion of the frame member.

6. The method of claim 4, said urging component stacks mounted adjacent to the engaged peripheral portion of the leadframe strip downwardly comprising urging said component stacks downwardly with a second surface portion of a frame structure of a window clamp.

7. The method of claim 6, said clampingly engaging and said urging occurring simultaneously.

* * * * *